(12) United States Patent
Lee et al.

(10) Patent No.: US 7,847,335 B2
(45) Date of Patent: Dec. 7, 2010

(54) NON-VOLATILE MEMORY DEVICE HAVING A GENERALLY L-SHAPED CROSS-SECTION SIDEWALL SONOS

(75) Inventors: Tzyh-Cheang Lee, Hsinchu (TW);
Tsung-Lin Lee, Hsinchu (TW);
Jiunn-Ren Hwang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 587 days.

(21) Appl. No.: 11/402,529

(22) Filed: Apr. 11, 2006

(65) Prior Publication Data

US 2007/0238237 A1    Oct. 11, 2007

(51) Int. Cl.
*H01L 29/788* (2006.01)
(52) U.S. Cl. .................. 257/316; 257/390; 257/319; 257/E21.626; 257/E29.152; 438/257; 438/197
(58) Field of Classification Search ............... 438/197; 257/390, 316, 319, E29.152, E21.626
See application file for complete search history.

(56) References Cited

U.S. PATENT DOCUMENTS

| 5,920,783 | A * | 7/1999 | Tseng et al. | 438/305 |
| 5,969,383 | A * | 10/1999 | Chang et al. | 257/316 |
| 6,255,172 | B1 * | 7/2001 | Huang et al. | 438/266 |
| 6,287,924 | B1 * | 9/2001 | Chao et al. | 438/300 |
| 6,632,714 | B2 * | 10/2003 | Yoshikawa | 438/258 |
| 6,797,602 | B1 * | 9/2004 | Kluth et al. | 438/592 |
| 2006/0043456 | A1 | 3/2006 | Derderian et al. | |

FOREIGN PATENT DOCUMENTS

EP    1231646 A2 *    8/2002

WO    WO 2004021448 A1 *    3/2004

OTHER PUBLICATIONS

English Translation of WO 2004/021448 A1.*
Streetman, B.G., et al., "Solid State Electronic Devices: 6.5.9 MOSFET Scaling and Hot Electron Effects," Fifth Edition, p. 308, 2000, Prentice Hall.
Wolf, S., et al., "Silicon Processing for the VLSI Era: Process Technology: Thermal Oxidation of Single Crystal Silicon," Table 1., Range of Thermal $SiO_2$ Thickness Used in VLSI Processing, 1986, p. 198, Lattice Press.
Wolf, S., "Silicon Processing for the VLSI Era: Process Intergration," 5.6.4 Techniques for Reducing Hot-Carrier Degradation, 1990, p. 354, Lattice Press.
Lee, Y.K., et al., "Twin-Bit Silicon-Oxide-Nitride-Oxide-Silicon (SONOS) Memory by Inverted Sidewall Patterning (TSM-ISP)," IEEE Transactions on Nanotechnology, vol. 2, No. 4, Dec. 2003, pp. 246-252.

* cited by examiner

*Primary Examiner*—Matthew E Warren
*Assistant Examiner*—David Z Chen
(74) *Attorney, Agent, or Firm*—Slater & Matsil, L.L.P.

(57) ABSTRACT

A non-volatile semiconductor memory device includes a gate stack formed on a substrate, semiconductor spacers, an oxide-nitride-oxide stack, and a contact pad. The semiconductor spacers are adjacent to sides of the gate stack and over the substrate. The oxide-nitride-oxide stack is located between the spacers and the gate stack, and located between the spacers and the substrate, such that the oxide-nitride-oxide stack has a generally L-shaped cross-section on at least one side of the gate stack. The contact pad is over and in electrical contact with the gate electrode and the semiconductor spacers. The contact pad may be further formed into recessed portions of the oxide-nitride-oxide stack between the gate electrode and the semiconductor spacers. The contact pad may include an epitaxial silicon having a metal silicide formed thereon.

10 Claims, 4 Drawing Sheets

NON-VOLATILE MEMORY DEVICE HAVING A GENERALLY L-SHAPED CROSS-SECTION SIDEWALL SONOS

TECHNICAL FIELD

The present invention generally relates to memory devices. In one aspect it relates more particularly to a system and method for a sidewall SONOS memory device.

BACKGROUND

Memory devices are important in integrated circuits because they can be embedded on a semiconductor chip instead of using a multi-chip solution with separate logic and memory chips. A non-volatile memory device is one that is capable of retaining stored data for a long period of time without any power supply. Consequently, non-volatile memory devices are ideally suited for both programming and data storage, which explains why embedded non-volatile memories may be found in a wide field of products, ranging from smart cards to communication IC's.

SONOS devices, which stands for silicon-oxide-nitride-oxide-silicon, is a preferred non-volatile memory device because of its better scaling perspectives and the ease of integration into a baseline CMOS process, compared to standard floating gate memory devices. Moreover, some performance parameters, such as the write/erase endurance and the required programming voltages, exceed those of flash memory devices. Unfortunately, conventional manufacturing processes for such SONOS devices are often complex, expensive processes, such as damascene-based processes. Hence, there is a need for an improved structure and method manufacturing a SONOS non-volatile memory device.

SUMMARY OF THE INVENTION

The problems and needs outlined above may be addressed by embodiments of the present invention. In accordance with one aspect of the present invention, a non-volatile semiconductor memory device is provided. The device includes a gate stack, semiconductor spacers, an oxide-nitride-oxide stack, and a contact pad. The gate stack is formed on a substrate. The gate stack includes a gate electrode over a gate dielectric. The semiconductor spacers are adjacent to sides of the gate stack and over the substrate. The oxide-nitride-oxide stack is located between the spacers and the gate stack, and located between the spacers and the substrate. The oxide-nitride-oxide stack has a generally L-shaped cross-section on at least one side of the gate stack. The contact pad is over and in electrical contact with the gate electrode and the semiconductor spacers. The gate electrode and semiconductor spacers preferably include polysilicon. The oxide-nitride-oxide stack may include a first oxide layer having a thickness of about 50 Å, a second oxide layer having a thickness of about 70 Å, and a nitride layer sandwiched between the first and second oxide layers, the nitride layer having a thickness of about 70 Å. The memory device may further include dielectric spacers formed adjacent to the semiconductor spacers. The contact pad may be further formed into recessed portions of the oxide-nitride-oxide stack between the gate electrode and the semiconductor spacers. The contact pad may include a metal silicide. The contact pad may include an epitaxial silicon having a metal silicide formed thereon.

In accordance with another aspect of the present invention, a method of manufacturing a non-volatile semiconductor memory device is provided. This method includes the following steps described in this paragraph. The order of the steps may vary, may be sequential, may overlap, may be in parallel, and combinations thereof, if not otherwise stated. A gate stack is formed on a substrate. The gate stack includes a gate electrode portion and a gate dielectric portion. An oxide-nitride-oxide stack is formed over the gate stack. A semiconductor layer is deposited over the oxide-nitride-oxide stack. Portions of the semiconductor layer and the oxide-nitride-oxide stack are removed to define semiconductor spacers adjacent the gate stack and over the substrate. The oxide-nitride-oxide stack is located between the spacers and the gate stack, and the oxide-nitride-oxide stack is located between the spacers and the substrate. The oxide-nitride-oxide stack has a generally L-shaped cross-section on at least one side of the gate stack. A contact pad is formed over and in electrical contact with the gate electrode and the semiconductor spacers. The depositing of the semiconductor layer may include depositing polysilicon, and the gate electrode may include polysilicon. The gate dielectric is preferably a tunneling oxide. The forming of the oxide-nitride-oxide stack may include: forming a first oxide layer of the oxide-nitride-oxide stack, the first oxide layer having a thickness of about 50 Å; forming a nitride layer of the oxide-nitride-oxide stack, the nitride layer having a thickness of about 70 Å; and forming a second oxide layer of the oxide-nitride-oxide stack, the second oxide layer having a thickness of about 70 Å. The method may further include forming dielectric spacers adjacent to the semiconductor spacers. The method may include etching back a portion of the oxide-nitride-oxide stack from the tops of the gate electrode and the semiconductor spacers, wherein forming the contact pad comprises forming the contact pad over and in electrical contact with the gate electrode and the semiconductor spacers and into the etched-back area between the gate electrode and the semiconductor spacers. The forming of the contact pad may include forming a metal silicide contact pad. The forming of the contact pad may include forming an epitaxial silicon layer having metal silicide formed thereon.

The foregoing has outlined rather broadly features of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1A:
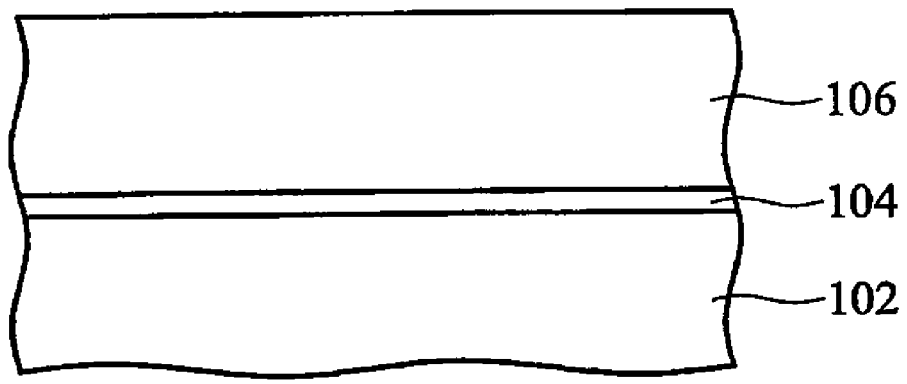
FIGS. 1A-1F illustrate cross-sectional views of progressive stages of forming a non-volatile SONOS memory device according to an embodiment of the disclosed manufacturing process.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Disclosed herein are SONOS memory devices and related methods of manufacturing the same. The disclosed technique employs a non-damascene based manufacturing process to create an oxide-nitride-oxide stack in between the gate electrode and adjacent semiconductor spacers, as well as in between those spacers and the substrate on which the device is formed. The disclosed principles then provide for a conductive contact that electrically connects the gate electrode and the semiconductor side-spacers, such that the single-contact design of the device allows for more compact device sizes and arrays.

In one embodiment, a method of manufacturing a non-volatile semiconductor memory device includes forming a dielectric layer over a substrate, depositing a first semiconductor layer over the dielectric layer, and then removing portions of the dielectric and first polysilicon layers to define a gate stack comprising a gate electrode over a gate dielectric. Such a method also includes forming an oxide-nitride-oxide stack over the gate stack, and depositing a second semiconductor layer over the oxide-nitride-oxide stack. Also, the method includes removing portions of the second semiconductor layer and the oxide-nitride-oxide stack to define semiconductor spacers adjacent the gate stack and over the substrate. The spacers have the oxide-nitride-oxide stack formed between the spacers and the gate stack, and also between the spacers and the substrate. This exemplary process is concluded by forming a contact pad over and in electrical contact with the gate electrode and the semiconductor spacers.

An exemplary non-volatile semiconductor memory device constructed using the disclosed principles may comprise a gate stack comprising a gate electrode over a gate dielectric formed on a substrate, and semiconductor spacers adjacent to sides of the gate stack and over the substrate. An oxide-nitride-oxide stack is located between the spacers and the gate stack, and between the spacers and the substrate. Such a device may also include a contact pad over and in electrical contact with the gate electrode and the semiconductor spacers. Next, illustrative embodiments of the present invention will be described in relation to the figures.

FIGS. 1A-1F are cross-sectional views of progressive stages of forming a non-volatile SONOS memory device 100 according to one illustrative embodiment of the disclosed manufacturing process. FIG. 1A illustrates an insulating layer 104 and a polysilicon layer 106 being formed over a semiconductor substrate 102. These may be formed using known materials and methods, for example. In a preferred embodiment, the semiconductor substrate 102 is silicon, although silicon-on-insulator (SOI) substrates may also be used. The insulating layer 104 is preferably silicon oxide, also characterized as thermal oxide or tunnel oxide. The thermal oxide 104 will eventually be used to form a gate oxide for the device, and its formation is followed by deposition of the polysilicon layer 106.

Figure 1B:
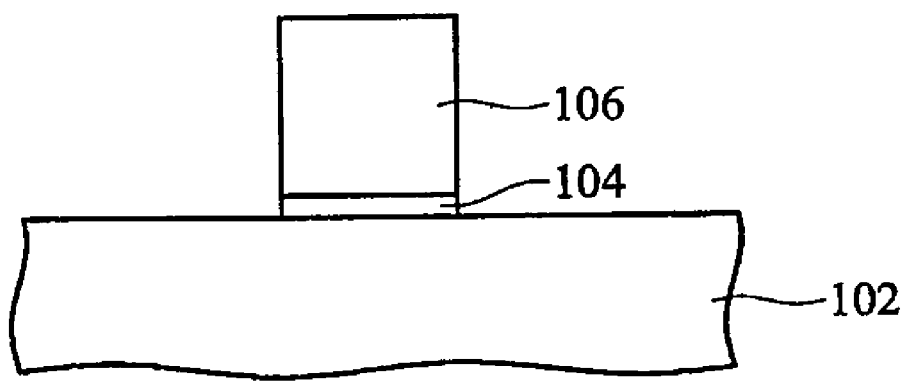

Subsequently, a gate stack is defined by non-damascene lithographic and etching techniques, for example, as illustrated in FIG. 1B. The lithographic and etching processes for the two layers 104, 106 can be performed in a single processing step or in multiple steps, resulting in the formation of the gate oxide 104 and the polysilicon gate electrode 106. For example, a photoresist may be deposited over the polysilicon layer 106 and then patterned and developed, leaving the eventual gate stack structure of the device protected. The unprotected areas of the polysilicon and oxide layers 104, 106 may then be etched away.

Figure 1C:
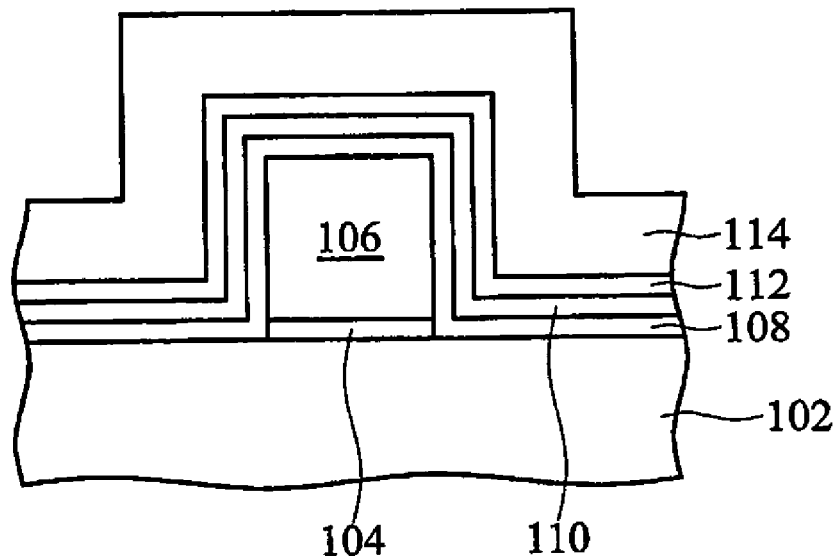

Taking the device 100 in FIG. 1B, a first oxide layer 108 is formed over the polysilicon gate electrode 106 and the gate oxide 104, followed by a silicon nitride layer 110 and a second oxide layer 112 as shown in FIG. 1C. These layers form an oxide-nitride-oxide stack, which is used within the memory device 100 to store binary data. Another polysilicon layer 114 is deposited over the gate stack and the oxide-nitride-oxide stack. The layers 108, 110, 112, 114 are preferably conformal about the gate stack structure (104, 106) because they can be uniformly deposited with known chemical vapor deposition or sputtering techniques. The film thicknesses for the different layers 108, 110, 112 can each vary from about 10 Å to 100 Å. In a preferred embodiment, the first oxide layer 108 has a thickness of about 50 Å, the silicon nitride layer 110 has a thickness of about 70 Å, and the second oxide layer 112 has a thickness of about 70 Å. Of course, any beneficial thickness for any of these layers may be employed.

Additionally, the layers 108, 110, 112, 114 may be deposited in a single step or in multiple steps, and with a single deposition chamber or with multiple deposition chambers. Within the ONO (oxide-nitride-oxide) stack 108, 110, 112, the nitride layer 110 functions like a floating gate of a standard flash cell. In other words, the process of programming and erasing in the SONOS memory device 100 is carried out in the nitride layer 110, which is at least partially insulated by the surround oxide layers 108, 112.

Figure 1D:
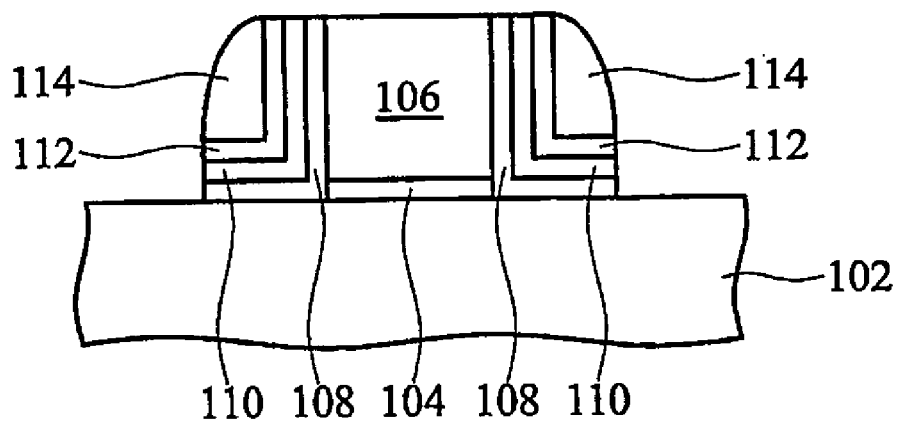

The SONOS memory device 100 is further defined by non-damascene lithographic and etching techniques to produce the structure illustrated in FIG. 1D. As shown, excess materials from the several layers 108, 110, 112, 114 are removed by, for example, depositing photoresist, patterning the resist, and then etching the unprotected areas. In addition, the top edges of the polysilicon layer 114 may be smoothed by known etching techniques. In a specific embodiment, chemical dry etching techniques may be used to smooth the edges of the polysilicon layer 114 as illustrated by the rounded spacer profile.

Figure 1E:
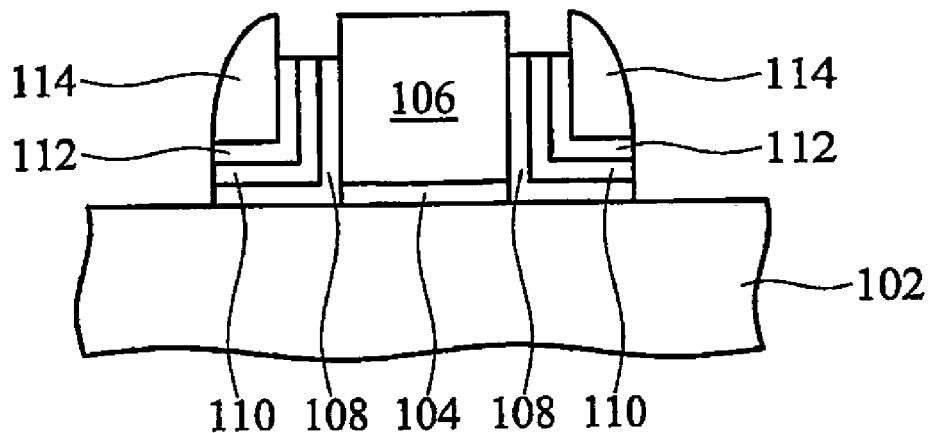

Taking the device as illustrated in FIG. 1D, the ONO stack 108, 110, 112 may be selectively etched as illustrated in FIG. 1E. As shown in FIG. 1E, the ONO stack 108, 110, 112 has been slightly recessed in the vertical direction from the top of the device 100. This is often referred to as an "etch-back" process. Reducing the ONO stack 108, 110, 112 facilitates subsequent processing steps, such as depositing a contact or a conductive material on top of the stack 108, 110, 112.

Figure 1F:
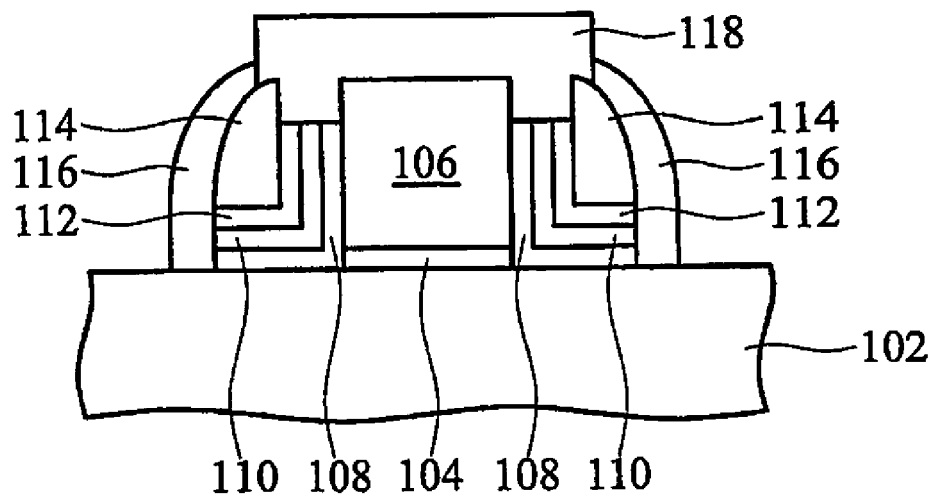

In many embodiments, before recessing the ONO stack 108, 110, 112, preferred yet optional spacers 116 may be formed around the device 100 to insulate it. This is shown in FIG. 1F (discussed more below), for example. The spacers 116 may be oxide or nitride, for example, to help protect the device 100 in subsequent processing steps. The spacers 116 may also protect against potential environmental damage and improve device reliability. Additionally, ion implantation of source and drain regions (not shown) may be formed on the surface of the silicon substrate 102 on the outside of the spacers 116. However, ion implantation may be performed before or after the formation of the spacers 116.

Taking the device as illustrated in FIG. 1F, a conductive layer 118 is formed (e.g., using known lithographic processes) over the structure. Preferably, the conductive layer 118 is first blanket deposited over the device 100. For example, the conductive layer 118 may be nickel, titanium, or cobalt, and deposited using conventional techniques, such as CVD. After the blanket deposit, the conductive layer 118 is etched (e.g., using photolithographic and dry etching techniques) to define a conductive contact layer 118 on top of the device 100, as shown in FIG. 1F. Annealing is then used so that the remaining portions of the conductive layer 118 react with the polysilicon and form metal silicide. In a preferred embodiment, the conductive layer 118 is a silicide contact, such as nickel silicide, titanium silicide, or cobalt silicide, for example. Additionally, other types of metal contacts may be formed, such as aluminum, gold, or tungsten, for example.

During the operation of the finished device 100, the conductive layer 118 allows a strong physical and electrical bond to be made to the device 100 using typical interconnects (e.g., tungsten plugs). Moreover, the conductive layer 18 provides good electrical contact between the gate electrode 106 and the adjacent polysilicon sidewalls 114. Such contact between these areas of the device 100 is even more important when the ONO stack 108, 110, 112 is relatively thick, if desired. Furthermore, the conductive layer 118 may also be used to form silicide contacts on the sides of the device 100. Specifically, once source and drain regions are formed on the sides of the device 100, the conductive layer 118 may also be selectively etched to form silicide pads over the source and drain regions in order to promote the physical and electrical contact with interconnects formed later.

By forming a semiconductor memory device 100 using a manufacturing process in accordance with the disclosed principles, several advantages may be found. For example, the non-damascene nature of the disclosed process results in a device having an oxide-nitride-oxide stack between the gate electrode and the polysilicon side-spacers, and also between the side-spacers and the substrate. As a result, a greater area within the finished device includes the oxide-nitride-oxide stack.

Moreover, even in conventional process (which are typically damascene-based processes) that may result in an oxide-nitride-oxide stack in these areas, such devices typically have isolated electrical contacts for the side-spacers (i.e., the control gates) and the gate electrode (i.e., the word line). In addition, such damascene-based processes are typically complex (for example, because of trying to isolate the side-spacers from the gate electrode), which usually results in increased manufacturing costs. In contrast, the disclosed technique results in a device having a single contact formed over and in electrical contact with the side-spacers and the gate electrode. And the non-damascene nature of the process constructs such a device using a simplified manufacturing process.

Figure 2A:
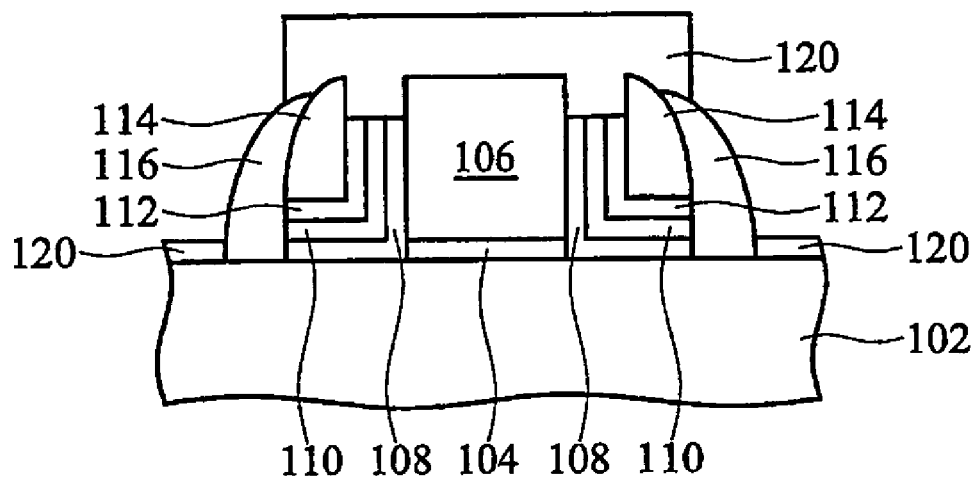
FIGS. 2A-2B illustrate cross-sectional views of an alternative embodiment of the disclosed manufacturing process.

In an alternate embodiment, instead of forming silicide contacts 118 to produce the finished device 100 illustrated of FIG. 1F, an epitaxial silicon layer 120 may be formed on the device 100 of FIG. 1E to produce the device 200 illustrated in FIG. 2A. Epitaxial silicon 120 is preferred in this embodiment when the ONO films 108, 110, 112 are very thick. When the ONO films 108, 110, 112 are thicker, the spacing between neighboring poly layers 106, 114 increases. As a result, electrical performance of silicide contacts 118 for neighboring poly layers 106, 114 with wider spacing across the ONO stack 108, 110, 112 degrades. Epitaxial silicon 120 can be formed using selective epitaxial growth techniques, for example. Additionally, selective epitaxial growth may also suppress short channel effects, junction leakage current, and reduce parasitic resistance in the finished device 200.

Figure 2B:
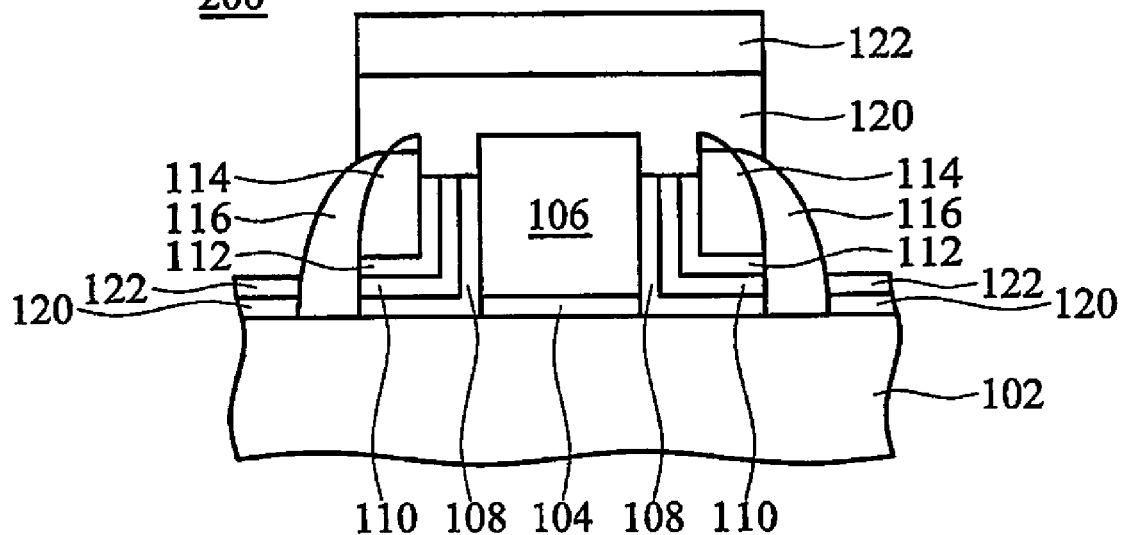

Taking the device as illustrated in FIG. 2A, silicide contacts 122 may be formed over the epitaxial layers 120, as shown in FIG. 2B. The types of metal silicides 122 include nickel silicide, titanium silicide, and cobalt silicide, but as before, any type of beneficial metal silicide may be formed. Forming metal silicide contacts 122 on the outer edges of the spacers 116 (over where the source and drain regions are typically formed in the substrate 102) provides another benefit by reducing an extra process step, i.e., the need to form extra metal contacts. Embodiments employing the epitaxial (or similar) layer 120 to electrically connect the gate electrode 106 and side-spacers 114 typically experience suppression of short channel effects, junction leakage current, and parasitic resistances, especially in embodiments where gaps between the gate electrode 106 and the side-spacers 114 is relatively large (e.g., about 100-300 Å for the oxide-nitride-oxide stack 108, 110, 112).

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a non-volatile semiconductor memory device, the method comprising:
    forming a gate stack on a substrate, the gate stack comprising a gate electrode having a top surface and a gate dielectric;
    forming an oxide-nitride-oxide stack over the gate stack, wherein the oxide-nitride-oxide stack comprises a first oxide layer, a nitride layer, and a second oxide layer;
    depositing a semiconductor layer over the oxide-nitride-oxide stack;
    removing portions of the semiconductor layer and the oxide-nitride-oxide stack to define semiconductor spacers adjacent the gate stack and over the substrate, the oxide-nitride-oxide stack being located between the semiconductor spacers and the gate stack, and being located between the semiconductor spacers and the substrate, such that the oxide-nitride-oxide stack has a generally L-shaped cross-section on at least one side of the gate stack;
    forming dielectric spacers, each dielectric spacer being immediately adjacent to a surface of one of the semiconductor spacers extending away from the substrate, and being immediately adjacent to a surface of the first oxide layer, the nitride layer, and the second oxide layer;
    etching back a portion of the oxide-nitride-oxide stack to form a recess between the gate electrode and the semiconductor spacers, wherein the recess is formed such that the first oxide layer, the nitride layer, and the second oxide layer each have a top surface that is below the top surface of the gate electrode; and forming a contact pad comprising forming a silicon layer having a metal silicide formed thereon, the contact pad being over and in electrical contact with the gate electrode and the semiconductor spacers, wherein the contact pad is adjacent to the dielectric spacers and substantially fills the recess.

2. The method of claim 1, wherein depositing the semiconductor layer comprises depositing polysilicon, and wherein the gate electrode comprises polysilicon.

3. The method of claim 1, wherein the gate dielectric is a tunneling oxide.

4. The method of claim 1, wherein forming of the oxide-nitride-oxide stack comprises:
forming the first oxide layer with a thickness of about 50 Å;
forming the nitride layer with a thickness of about 70 Å; and
forming the second oxide layer with a thickness of about 70 Å.

5. A non-volatile semiconductor memory device, comprising:
a gate stack formed on a substrate, the gate stack comprising a gate electrode over a gate dielectric, wherein the gate electrode has a top surface;
semiconductor spacers proximate to sides of the gate stack and over the substrate;
an oxide-nitride-oxide stack comprising a first oxide layer, a nitride layer, and a second oxide layer, wherein the oxide-nitride-oxide stack is located between the semiconductor spacers and the gate stack, and located between the semiconductor spacers and the substrate, such that the oxide-nitride-oxide stack has a generally L-shaped cross-section on at least one side of the gate stack; and
a contact pad comprising silicon having a metal silicide formed thereon, wherein the silicon is over and in electrical contact with the gate electrode and the semiconductor spacers, wherein the silicon substantially fills a recess etched from the oxide-nitride-oxide stack between the gate electrode and the semiconductor spacers, wherein the recess is etched such that the first oxide layer, the nitride layer, and the second oxide layer each have a top surface below the top surface of the gate electrode.

6. The device of claim 5, wherein the gate electrode and semiconductor spacers comprise polysilicon.

7. The device of claim 5, wherein:
the first oxide layer has a thickness of about 50 Å;
the second oxide layer has a thickness of about 70 Å; and
the nitride layer is sandwiched between the first and second oxide layers, the nitride layer having a thickness of about 70 Å.

8. The device of claim 5, further comprises dielectric spacers formed adjacent to the semiconductor spacers.

9. A non-volatile semiconductor memory device, comprising:
a gate stack formed on a semiconductor substrate, the gate stack comprising a polysilicon gate electrode over a tunneling oxide layer, wherein the gate electrode has a top surface;
polysilicon spacers proximate to sides of the gate stack and over the substrate;
an oxide-nitride-oxide stack comprising a first oxide layer, a nitride layer, and a second oxide layer, wherein the oxide-nitride-oxide stack is located between the polysilicon spacers and the gate stack, and located between the polysilicon spacers and the substrate, such that the oxide-nitride-oxide stack has a generally L-shaped cross-section on at least one side of the gate stack;
dielectric spacers, each dielectric spacer being immediately adjacent to a surface of one of the polysilicon spacers extending away from the substrate, and immediately adjacent to a surface of the first oxide layer, the nitride layer, and the second oxide layer; and
a silicide contact pad comprising a silicide portion and a silicon portion, the silicon portion being over and in electrical contact with the gate electrode and the polysilicon spacers, wherein the silicon portion substantially fills a recess of the oxide-nitride-oxide stack between the gate electrode and the polysilicon spacers, wherein the recess extends such that the first oxide layer, the nitride layer, and the second oxide layer each have a top surface below the top surface of the gate electrode, the silicide portion being formed over the silicon portion.

10. The device according to claim 9, wherein:
the first oxide layer has a thickness of about 50 Å;
the second oxide layer has a thickness of about 70 Å; and
the nitride layer is sandwiched between the first and second oxide layers, the nitride layer having a thickness of about 70 Å.

* * * * *